(12) United States Patent
Levy et al.

(10) Patent No.: US 11,757,408 B2
(45) Date of Patent: Sep. 12, 2023

(54) ELECTRIC FIELD DETECTOR

(71) Applicant: OFFICE NATIONAL D'ETUDES ET DE RECHERCHES AÉROSPATIALES, Palaiseau (FR)

(72) Inventors: Raphael Levy, Malakoff (FR); Thomas Perrier, Paris (FR); Pierre Lavenus, Chatenay Malabry (FR); Jean Guerard, Juvisy-sur-Orge (FR); Vincent Gaudineau, Palaiseau (FR)

(73) Assignee: OFFICE NATIONAL D'ETUDES ET DE RECHERCHES AÉROSPATIALES, Palaiseau (FR)

( * ) Notice: Subject to any disclaimer, the term of this patent is extended or adjusted under 35 U.S.C. 154(b) by 0 days.

(21) Appl. No.: 17/914,258

(22) PCT Filed: Mar. 8, 2021

(86) PCT No.: PCT/FR2021/050388
§ 371 (c)(1),
(2) Date: Sep. 23, 2022

(87) PCT Pub. No.: WO2021/191520
PCT Pub. Date: Sep. 30, 2021

(65) Prior Publication Data
US 2023/0112323 A1 Apr. 13, 2023

(30) Foreign Application Priority Data
Mar. 26, 2020 (FR) ....................... 2003001

(51) Int. Cl.
*H03B 5/32* (2006.01)
*H10N 30/85* (2023.01)
(Continued)

(52) U.S. Cl.
CPC ............... *H03B 5/32* (2013.01); *G01R 29/12* (2013.01); *H03H 9/215* (2013.01); *H10N 30/85* (2023.02)

(58) Field of Classification Search
CPC . H03B 5/32; H03B 5/36; G01R 29/12; H03H 9/215; H03H 9/21; H10N 30/85
See application file for complete search history.

(56) References Cited

U.S. PATENT DOCUMENTS 4,625,176 A * 11/1986 Champion ............. G01R 29/24
 324/458
4,720,682 A 1/1988 Ikushima et al.
(Continued)

FOREIGN PATENT DOCUMENTS

EP 0 137 148 4/1985

OTHER PUBLICATIONS

International Search Report and Written Opinion of the ISA for PCT/FR2021/050388 dated Jun. 21, 2021, 11 pages.

*Primary Examiner* — Jeffrey M Shin
(74) *Attorney, Agent, or Firm* — NIXON & VANDERHYE

(57) ABSTRACT

An electrical field detector includes an electromechanical oscillator, part of which is included of a piezoelectric element, a frequency measuring device which is coupled to the oscillator so as to measure the oscillation frequency, and an electrical masking assembly. The electrical masking assembly is arranged close to the piezoelectric element so that, during an use of the detector, the piezoelectric element moves by vibrating relative to the electrical masking assembly. A variable part of the piezoelectric element is thus exposed to the electrical field to be measured. A change in the oscillating frequency then forms an electrical field measurement result.

20 Claims, 3 Drawing Sheets

(51) Int. Cl.
G01R 29/12 (2006.01)
H03H 9/215 (2006.01)

(56) References Cited

U.S. PATENT DOCUMENTS

| | | | | |
|---|---|---|---|---|
| 5,539,319 A | * | 7/1996 | Yamada | G01R 5/28 |
| | | | | 324/458 |
| 5,592,130 A | * | 1/1997 | Ikeda | H03B 5/36 |
| | | | | 29/25.35 |
| 6,014,028 A | | 1/2000 | Ohashi et al. | |
| 2003/0038638 A1 | | 2/2003 | Kieres et al. | |

* cited by examiner

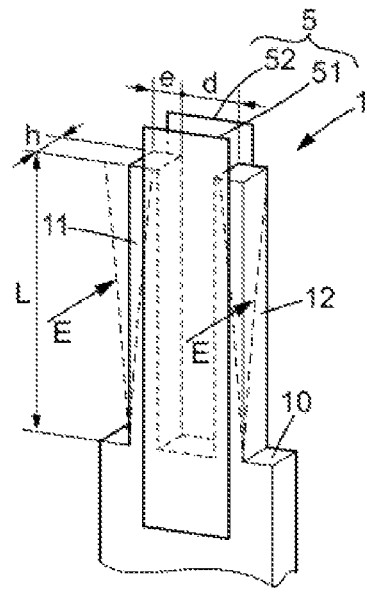
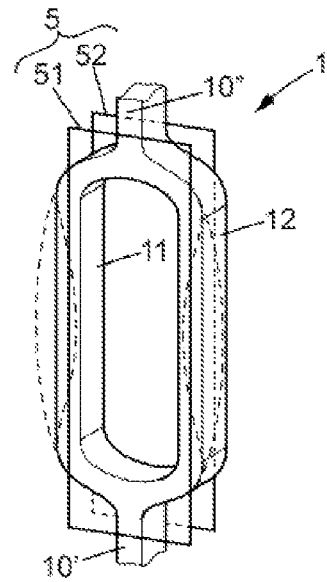
FIG. 2a          FIG. 3
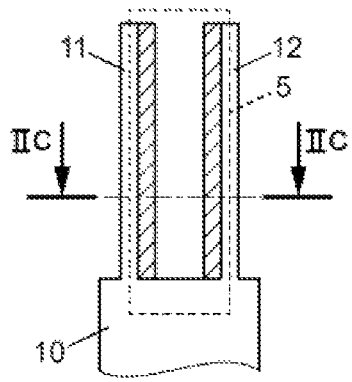
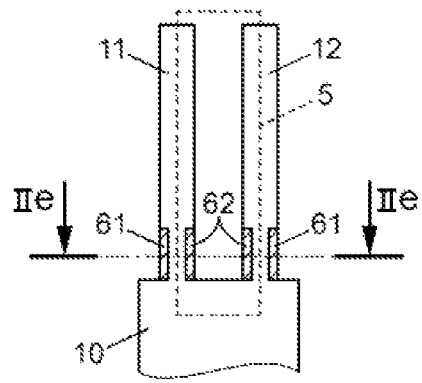
FIG. 2b          FIG. 2d
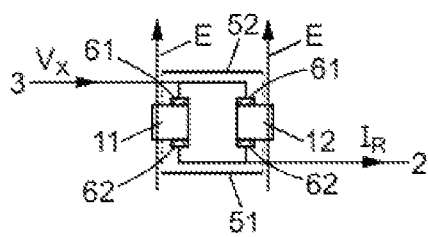
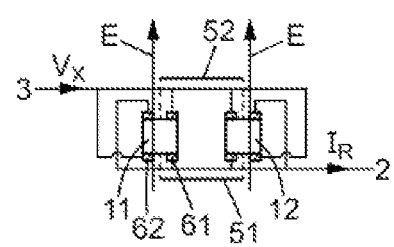
FIG. 2c          FIG. 2e

ELECTRIC FIELD DETECTOR

CROSS-REFERENCE TO RELATED APPLICATIONS

This application is the U.S. national phase of International Application No. PCT/FR2021/050388 filed Mar. 8, 2021 which designated the U.S. and claims priority to French Patent Application No. 2003001 filed Mar. 26, 2020, the entire contents of each of which are hereby incorporated by reference.

BACKGROUND OF THE INVENTION

Field of the Invention

This description relates to an electrical field detector.

Description of the Related Art

Electrical field detectors are known which comprise at least one electrode and a movable mask. The movable mask is made of an electrically conducting material, and placed in front of the electrode or electrodes so as to partially mask it or them from the electrical field to be measured. One or more variable part(s) of this (these) electrode(s) is (are) thus exposed to the electrical field to be measured, generating electrical current(s) in one or more connection(s) which link(s) the (each) electrode to an electrical current detector. The electrical current(s) which is (are) detected constitute(s) a measurement of the electrical field. But such detectors are bulky, expensive, and energy-consuming, so they are not suitable for many applications, in particular applications for electrostatic field measurement on board an aircraft, a drone, or a satellite.

To overcome these disadvantages, electrical field detectors have recently been developed based on MEMS ("Micro Electro-Mechanical Systems") devices made of silicon. However, utilizing an electrical field to vibrate the MEMS device during each measurement leads to biases in the measurement results. In addition, the measurement proceeds by evaluating a quantity of electrical charges, requiring the use of a high-resolution analog-to-digital converter. Such converter is itself expensive and is responsible for significant energy consumption.

SUMMARY OF THE INVENTION

Based on this situation, an object of the present invention is to propose a new electrical field detector which is compact, inexpensive, low in energy consumption, and for which the measurement results are accurate and reliable.

To at least partially achieve this object or others, a first aspect of the invention proposes an electrical field detector which comprises:
- an electromechanical oscillator, of which at least part is comprised of a piezoelectric element intended to vibrate at an oscillation frequency during an use of the detector;
- a frequency measuring device, which is coupled to the oscillator so as to measure the oscillation frequency; and
- an electrical masking assembly, which is arranged close to the piezoelectric element without contact with this element, so that, during the use of the detector, the piezoelectric element moves by vibrating relative to the electrical masking assembly.

According to the invention, the electrical masking assembly is further arranged so that a part of the piezoelectric element which is exposed to the electrical field to be measured during the use of the detector, while being restricted by this electrical masking assembly, varies during each oscillation of the oscillator. The electrical field to be measured, which acts on the exposed and variable part of the piezoelectric element during the use of the detector, produces a change in the oscillation frequency which is measured by the frequency measuring device. The oscillation frequency thus forms the electrical field strength measurement result.

The invention therefore solves the disadvantages of detectors of the prior art by using a piezoelectric oscillator. Such oscillators are indeed inexpensive, light and of small size. Moreover, their use does not require generating electrical fields likely to produce bias in the measurement results.

In general for the invention, the material of the piezoelectric element may have various chemical compositions. In particular, this piezoelectric element may be a portion of crystal quartz, a portion of aluminum nitride (AlN), a portion of gallium phosphate ($GaPO_4$), or a portion of langatate crystal commonly designated by the acronym LGT and corresponding to the chemical formula $La_3Ga_{5.5}Ta_{0.5}O_{14}$, where La denotes the element lanthanum, Ga denotes the element gallium, Ta denotes the element tantalum and O denotes the element oxygen. Such crystalline materials are available in the form of thin slices, or "wafers", which can be chemically etched in order to obtain the piezoelectric element with the desired shape for this element.

Again in general, the piezoelectric element may have various shapes, suitable for producing the vibrations necessary for the operation of the oscillator. Thus, in various possible embodiments of the invention, the piezoelectric element may comprise one of the following structures:
- a beam intended to vibrate by bending during the use of the detector, in particular a beam which has a first fixed end and another free end opposite the first end;
- two parallel beams each intended to vibrate by bending during the use of the detector, both beams being connected to each other by a respective first end of each beam, the other end of each beam, opposite its first end, being free; or
- two parallel beams each intended to vibrate by bending during the use of the detector, both beams being connected to each other on the one hand by two respective first ends of these beams, and on the other hand by their other ends which are opposite the first ends.

The electrical masking assembly may comprise at least one metal portion, an edge of this metal portion being arranged in front of the piezoelectric element so as to partially mask it with respect to the electrical field to be measured, at at least one instant during each oscillation. Preferably, however, this electrical masking assembly may comprise two metal portions which produce identical partial maskings of the piezoelectric element with respect to the electrical field to be measured, symmetrically on two opposite sides of the piezoelectric element, when the detector is oriented so that both metal portions are perpendicular to the electrical field to be measured.

In general, the electromechanical oscillator may comprise, in addition to the piezoelectric element, at least one electronic amplifier which is electrically connected to electrodes in contact with the piezoelectric element, so as to form a loss-compensation oscillator loop structure. In such case, one of the electrodes may be electrically connected to an output of the amplifier, in order to transmit an excitation voltage to the piezoelectric element during the use of the detector, and another of the electrodes may be connected to an input of an electrical current detection system in order to detect a response electrical current originating from the piezoelectric element. An output of the electrical current detection system is then connected to an input of the amplifier, to form the loop structure.

Advantageously, one of the electrodes, and preferably each electrode, may be located on the piezoelectric element at a location which is masked by the electrical masking assembly with respect to the electrical field to be measured, during the use of the detector. A measurement bias that could be caused by each electrode can thus be reduced or eliminated.

Finally, a second aspect of the invention proposes an electrical field detection assembly, which comprises two detectors each according to the first aspect. These two detectors have piezoelectric elements which are identical, and respective electrical masking assemblies which are different. The electrical field to be measured, when it is non-zero, thus produces changes in the oscillation frequency which differ between both detectors. The detection assembly further comprises a subtraction unit, which is arranged to characterize a difference between the oscillation frequencies measured by the respective frequency measuring devices of both detectors. This difference then forms another electrical field strength measurement result, which is less sensitive to variations in ambient temperature than the measurement results delivered separately by each of the two detectors. Indeed, as the piezoelectric elements of both detectors are identical, a variation in the ambient temperature produces shifts in the oscillation frequency which are identical for both detectors in the absence of an electrical field to be measured. But when the electrical field to be measured is non-zero, it creates modifications in the oscillation frequency which differ between both detectors, due to their different respective electrical masking assemblies. The subtraction unit then makes it possible to eliminate a contribution from the variation in ambient temperature from the electrical field measurement result.

BRIEF DESCRIPTION OF THE DRAWINGS

The features and advantages of the invention will become more apparent in the following detailed description of some non-limiting exemplary embodiments, with reference to the appended figures which include:

FIG. 2a is a perspective view of a piezoelectric element that can be used in the detector of FIG. 1;

FIG. 2b is a front view of the piezoelectric element of FIG. 2a, showing electrodes arranged on the element;

FIG. 2c is a cross-sectional view which corresponds to FIG. 2b;

FIG. 2d corresponds to FIG. 2b for an alternative embodiment;

FIG. 2e is a cross-sectional view which corresponds to FIG. 2d;

FIG. 3 is a perspective view of another piezoelectric element which may alternatively be used in the detector of FIG. 1;

DESCRIPTION OF THE PREFERRED EMBODIMENTS

For clarity, the dimensions of the elements shown in these figures do not correspond to actual dimensions nor to actual dimension ratios. Furthermore, some of these elements are only represented symbolically, and identical references indicated in different figures designate elements which are identical or which have identical functions.

Figure 1:
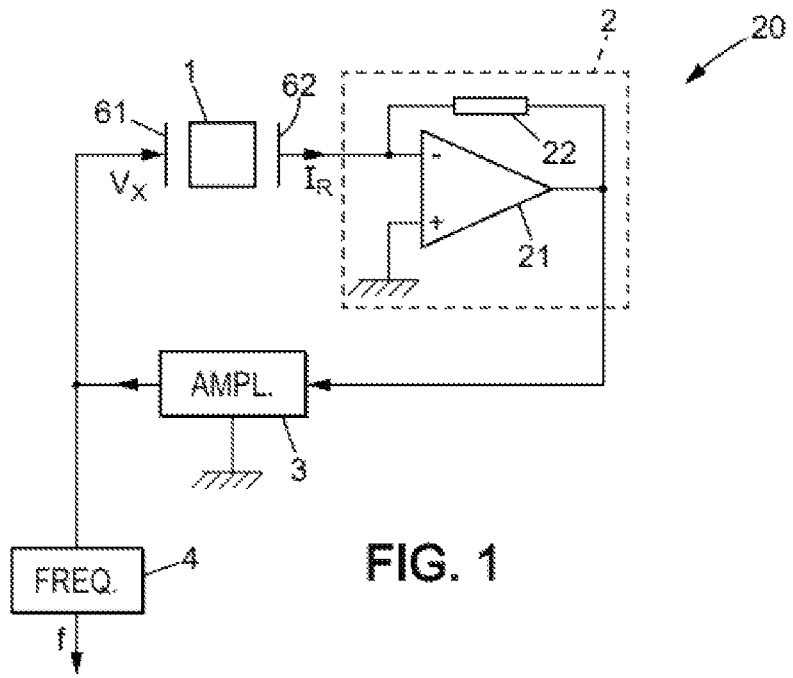
FIG. 1 is a block diagram of an electrical field detector in accordance with the invention.

In accordance with FIG. 1, a detector 20 according to the invention comprises an electromechanical oscillator, a frequency measuring device, and an electrical masking assembly. The electrical masking assembly, which is not visible in FIG. 1, will be described with reference to FIG. 2a. The electromechanical oscillator comprises a piezoelectric element 1 which is provided with a pair of electrodes 61 and 62, for applying an excitation voltage $V_X$ to the element 1 and for collecting a response signal which is produced by this element 1, for example a response electrical current $I_R$. In a known manner, the oscillator is formed by a loop structure which comprises, in addition to the piezoelectric element 1, a detection system for detecting the response current $I_R$, designated by reference number 2, and an amplifier, denoted AMPL. and designated by number reference 3. The current detection system 2 may be formed based on an operational amplifier 21 which has an inverting input, a non-inverting input, and an output, and an electrical resistor 22. The non-inverting input of the operational amplifier 21 is connected to an electrical ground of the detector 20, the inverting input is connected to electrode 62 which delivers the response electrical current $I_R$ from the piezoelectric element 1, and the resistor 22 is connected between the inverting input and the output of the operational amplifier 21. Under these conditions, the electrical current detection system 2 outputs a voltage which is proportional to the response current $I_R$. Other electrical structures are possible for the current detection system 2, and are known to those skilled in the art. The output of the current detection system 2 is connected to an input of the amplifier 3, and an output of this amplifier 3 supplies the excitation voltage $V_X$ which is applied to electrode 61. Such a loop structure makes it possible to compensate for energy losses and to meet the phase condition which is necessary for the existence of spontaneous oscillations. These oscillations cause vibrations of the piezoelectric element 1, and their frequency is the resonance frequency of the oscillator when it is used in an open-loop circuit and in sinusoidal driving mode. The frequency measuring device is designated by reference number 4 and denoted FREQ. It may be connected to the output of the amplifier 3, in parallel with electrode 61. It may be a standard electronic frequency-meter as commercially available.

The piezoelectric element 1 may be a crystal quartz tuning fork as shown in FIG. 2a. It is thus comprised of two beams 11 and 12, parallel to and spaced from each other, which are rigidly connected to each other by only one of their respective ends, via a fixed base part 10. Such beam model is said to have one free end and one embedded end. The dotted outlines show bending deformations of both beams 11 and 12. In principle, the end of each beam 11, 12 which is rigidly connected to the base part 10 corresponds to a vibration node of the element 1. The longitudinal direction of the beams 11 and 12 is parallel to crystallographic direction Y of the crystal quartz used to form the piezoelectric element 1, and the plane of the tuning fork is perpendicular to crystallographic direction X. FIG. 2a also shows the electrical masking assembly 5, which is comprised of two metal plates 51 and 52. Reference letter E designates the electrical field to be measured, which passes through each beam 11, 12 of the piezoelectric element 1 in the side portions of the beams which protrude beyond the metal plates 51 and 52. For appropriate use of the detector 20, it is oriented so that the electrical field E is substantially perpendicular to the metal plates 51 and 52.

FIG. 2b and FIG. 2c show a first possible arrangement for the electrodes 61 and 62 on the piezoelectric element 1. They are arranged longitudinally on each beam 11, 12, along the entire length or almost the entire length of the beams, on the beam faces which are coplanar, and against the edges of the beams which are closest to the central axis of the tuning fork. Electrode 61 thus has two electrode segments which are arranged one on beam 11 and the other on beam 12, on the same side of the tuning fork. Similarly, electrode 62 also has two electrode segments which are arranged one on beam 11 and the other on beam 12, on the other side of the tuning fork from electrode 61. Electrodes 61 and 62 arranged in this manner cause elongations or contractions of the inner edges of the two beams 11 and 12, which are identical at each instant of the vibrations. All the electrode segments thus arranged are masked by the metal plates 51 and 52 with respect to the electrical field to be measured E.

FIG. 2d and FIG. 2e show a second possible arrangement for the electrodes 61 and 62. They are now limited to the part of each beam 11, 12 which is close to the base part 10, and each electrode 61, 62 comprises two pairs of electrode segments which are arranged and connected so as to generate, at the foot of each beam 11, 12, opposite electrical fields between the inner side and outer side of each beam, while still being symmetrical between the two beams 11 and 12. Such mode of piezoelectric excitation of the tuning fork causes a "hinging" of each beam 11, 12 relative to the base part 10, each beam then vibrating by bending from this hinge.

FIG. 3 shows another possible model for the piezoelectric element 1. It is still comprised of two beams 11 and 12, identical and parallel, but these are now connected to each other by their two respective ends, and are connected to two fixed base parts 10' and 10". Such model of the piezoelectric element is said to be hinged-hinged in the jargon of those skilled in the art. Each of the beams 11, 12 still vibrates by bending parallel to the plane of the piezoelectric element 1, with opposite instantaneous directions of bending for the two beams, and instantaneous deflection values of identical absolute values for the two beams. For this other model of the piezoelectric element 1, the electrodes 61 and 62 may have a configuration on both beams 11 and 12 which is similar to that of FIG. 2b and FIG. 2c, while being restricted to a central part along the length of the beams.

Other models are still possible for the piezoelectric element 1, in particular models with a single vibrating beam, of which one end is free and the other end, said to be "embedded", is rigidly connected to a fixed base part of the element. In a known manner, piezoelectric elements such as those just described may be manufactured by chemical etching or reactive ionic etching from a crystal quartz wafer.

Figure 4:
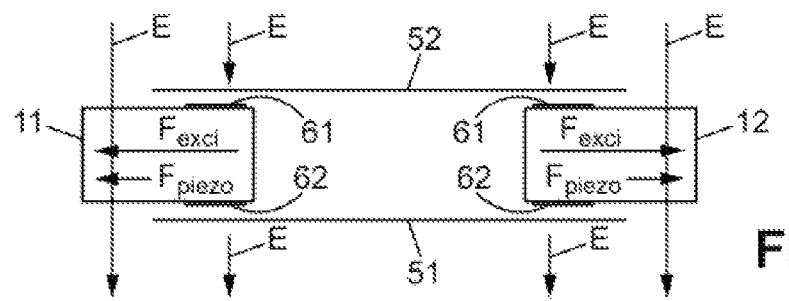
FIG. 4 is a cross-sectional view which illustrates the operating principle of the detector of FIG. 1.

In accordance with FIG. 4, the piezoelectric element 1, for example that of FIG. 2a-FIG. 2c, is inserted between two electrical masks 51 and 52 which are arranged parallel to each other on the two opposite sides of the element 1 but without contact therewith. Both electrical masks 51 and 52 form the electrical masking assembly 5. They are symmetrical in order to mask part of the piezoelectric element 1 from the external electrical field E. This latter is perpendicular to both masks 51 and 52 during optimal use of the detector 20. In other words, the two metal plates 51 and 52 are superposed in a common projection plane which is parallel to the plates. In addition, both metal plates 51 and 52 are sized to mask a limited part of the piezoelectric element 1, which varies during each vibration. For the models of the piezoelectric element 1 shown in FIG. 2a and FIG. 3, both metal plates 51 and 52 can mask a respective part of each beam 11, 12, which is located towards the center of the element, with the edges of these plates being parallel and superposed on a central longitudinal area of each beam, as shown in the figures. In this manner, a longitudinal part of each beam 11, 12, which is close to its outer edge, meaning close to the one of its faces which is facing away from the other beam, is exclusively exposed to the electrical field E. In addition, this exposed part has a volume which varies according to the instantaneous state of vibration of the beam. In some possible embodiments for each metal plate 51, 52, the plate may be comprised of a metal layer portion, for example made of silver (Ag) or gold (Au), which has been deposited on a flat substrate such as a glass plate. Both metal plates 51 and 52 are electrically connected to each other, and may be left at a floating electrical potential or may be connected to an electrical potential reference terminal. In some simplified embodiments of the invention, the electrical mask assembly 5 may comprise only a single metal plate, on only one of the sides of the piezoelectric element 1.

We will now describe the operation principle of the detector 20, with reference to FIG. 4. The excitation voltage $V_X$ produces, within the piezoelectric element 1, a distribution of stresses which causes vibration of the element 1. In the absence of an external electrical field, the spontaneous oscillation of the electromechanical oscillator has a frequency value $f_0$, which is its natural oscillation frequency. This value $f_0$ mainly depends on the dimensions of the piezoelectric element 1, on intrinsic parameters, on values of elasticity parameters of the piezoelectric material, and on electrical parameters of the whole oscillator. The operation of such oscillator at its natural oscillation frequency value $f_0$ is known to those skilled in the art. In particular, during oscillations at this natural frequency value $f_0$, the excitation voltage $V_X$ is in phase-quadrature relative to the deformation of the piezoelectric element 1. Indeed, the excitation voltage $V_X$ then exactly compensates for dissipative losses, such as losses by viscous friction of the piezoelectric element 1 in a surrounding gas. However, such losses are proportional to the instantaneous speed of deformation of the piezoelectric element 1. More precisely, the excitation voltage $V_X$ generates, in each beam 11, 12, a piezoelectric excitation force which is denoted $F_{exci}$ and which maintains the vibrations of element 1 in a steady state of oscillation. The natural oscillation frequency value $f_0$, in the absence of any external electrical field, can be measured experimentally by the frequency measuring device 4.

The external electrical field which is denoted E is the electrical field to be measured. When it is non-zero, it passes through the piezoelectric element 1 in the part thereof which is not masked by the electrical masking assembly 5. In this non-masked part, meaning the part exposed to the electrical field E, and which may be divided between both beams 11 and 12 as in the examples of the figures, the electrical field E causes an additional piezoelectric force, denoted $F_{piezo}$, which is proportional to the instantaneous fraction of the piezoelectric element 1 which is passed-through by the electrical field E. This additional force $F_{piezo}$ is thus proportional to the instantaneous deformation of the piezoelectric element 1.

In the presence of the electrical field E to be measured, the piezoelectric excitation force $F_{exci}$ generated by the excitation voltage $V_X$ in the element 1 is much greater than the additional piezoelectric force $F_{piezo}$. For this reason, the value of the phase difference between the piezoelectric excitation force $F_{exci}$ and the deformation of the piezoelectric element 1 is not significantly modified. It follows that both forces $F_{piezo}$ and $F_{exci}$ are in phase-quadrature relative to each other. Thanks to this phase-quadrature relationship, the change in value caused by the additional piezoelectric force $F_{piezo}$ on the oscillation frequency of the oscillator in the presence of the electrical field E is maximal, when all other parameters of the oscillator remain unchanged. Then: $\Delta f=(F_{piezo}/F_{exci})\cdot f_0/(2\cdot Q)$, where $\Delta f$ is the variation in oscillation frequency caused by the electrical field E, and Q is the quality factor of the piezoelectric element 1 when used as an open loop resonator and in sinusoidal driving mode. The variation $\Delta f$ is equal to the difference $f-f_0$, where f is the oscillation frequency as measured by the device 4 in the presence of the electrical field E. The variation in oscillation frequency $\Delta f$ is proportional to the electrical field E: $\Delta f=K\cdot E$, the proportionality coefficient K depending in particular on the geometric and electromechanical features of the piezoelectric element 1, and on the geometric features of the masking assembly 5. It can be determined by digital modeling of the electromechanical oscillator, or by calibration of the detector 20. For a piezoelectric element 1 which is of monocrystalline quartz and in accordance with FIG. 2a, K is equal to approximately 4 µHz/(V/m) (microhertz per volt-per-meter) when both beams 11 and 12 each have a length L equal to 3 mm (millimeters), a width e in the plane of the tuning fork equal to 200 µm (micrometers), and a thickness h measured perpendicular to the plane of the tuning fork equal to 30 µm, and when both beams 11 and 12 are spaced apart by a distance d equal to 100 µm. The value of the oscillation frequency f as delivered by the device 4 therefore constitutes a measurement of the electrical field E: $E=(f-f_0)/K$.

However, the natural oscillation frequency $f_0$, which is measured by the device 4 when the electrical field E is zero, may vary depending on the temperature of the piezoelectric element 1, i.e. the ambient temperature at which the detector 20 is used. The detector 20 as described above does not allow separating, within the change in the oscillation frequency f, the contribution of the variation in the natural oscillation frequency $f_0$ which is due to a variation in the ambient temperature, from the contribution which is produced by the electrical field to be measured E. The detection assembly which is now described with reference to FIG. 5 allows eliminating the thermal contribution which affects the natural oscillation frequency $f_0$, so that the measurement result which is delivered by such detection assembly characterizes only the electrical field to be measured, and so that this result is the same, or substantially the same, regardless of the ambient temperature. Such improvement may be particularly useful when the ambient temperature is likely to vary significantly, as this is the case on board a satellite for example.

Figure 5:
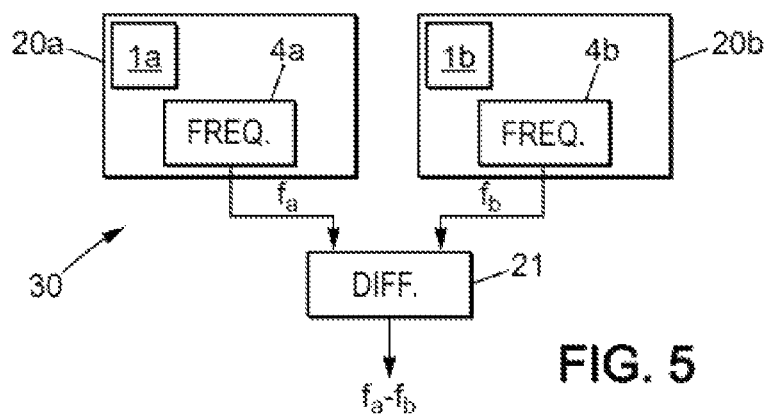
FIG. 5 is a block diagram of an electrical field detection assembly which is in accordance with the invention.

In accordance with FIG. 5, the detection assembly of the electrical field E is generally designated by reference number 30, and comprises two detectors 20a and 20b which are each in accordance with the detector 20 of FIG. 1. These two detectors 20a and 20b are identical to each other, apart from their electrical masking assemblies. In particular, both detectors 20a and 20b have respective piezoelectric elements 1a and 1b which are identical and oriented identically, possibly of the monocrystalline quartz tuning fork type as shown in FIG. 2a. They thus have the same natural oscillation frequency $f_0$, and this latter varies with the ambient temperature in the same manner for both detectors 20a and 20b. These two piezoelectric elements 1a and 1b are arranged in a fixed manner within the detection assembly 30, close enough to each other to be exposed to the same electrical field to be measured E. On the other hand, both detectors 20a and 20b have respective electrical masking assemblies which are different, so that the coefficient K as defined above has two values which are different: Ka for detector 20a and Kb for detector 20b. The references 4a and 4b designate the respective devices for measuring the oscillation frequency of the detectors 20a and 20b. Thus, in the presence of the electrical field to be measured E, device 4a provides the first oscillation frequency value $f_a=f_0+K_a\cdot E$, and device 4b provides the second oscillation frequency value $f_b=f_0+K_b\cdot E$. These two values are transmitted to a subtraction unit 21, which is denoted DIFF. and which calculates the difference value $f_a-f_b=(K_a-K_b)\cdot E$. This difference value, which constitutes a new measurement of the electrical field E, is independent of the natural oscillation frequency $f_0$ of the respective oscillators of both detectors 20a and 20b. It therefore is no longer dependent on the ambient temperature, through this natural oscillation frequency $f_0$. A residual dependency of the difference $f_a-f_b$ with respect to the ambient temperature may still occur through the coefficients $K_a$ and $K_b$, but it is less than the separate variations of the oscillation frequencies $f_0$, $f_a$, and $f_b$ as functions of the temperature.

Figure 6A:
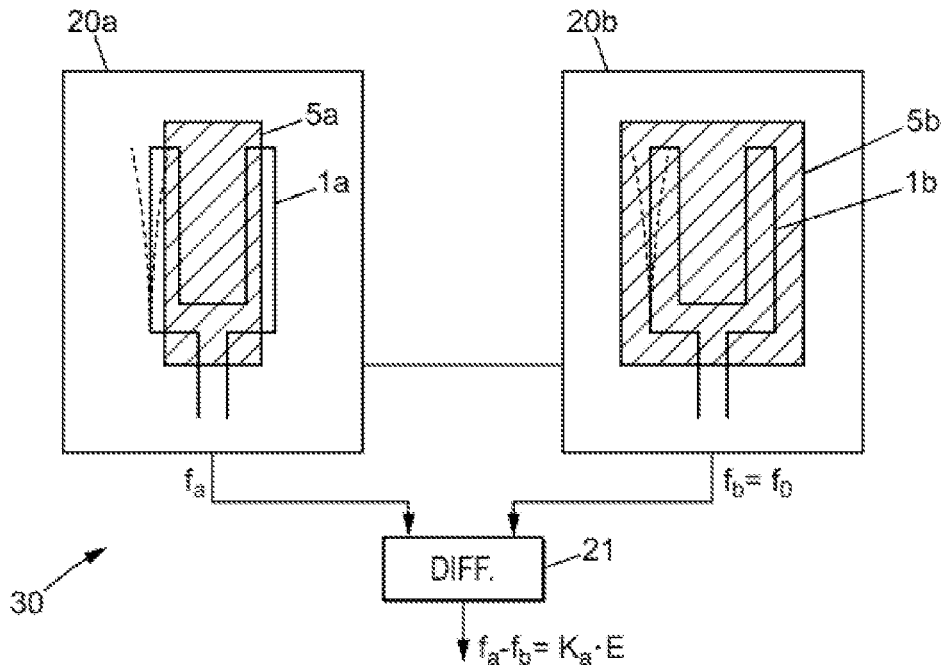
FIG. 6a shows a first possible variant for the detection assembly of FIG. 5.

According to a first possibility, the electrical masking assembly of detector 20b, which is denoted by reference 5b, may be selected with dimensions and a position such that it entirely and continuously masks the piezoelectric element 1b of detector 20b during vibrations, with respect to the electrical field E. Detector 20b is thus insensitive to the electrical field E: coefficient $K_b$ is zero and frequency $f_b$ which is measured by device 4b is continuously equal to the natural oscillation frequency $f_0$. The electrical masking assembly of detector 20a, which is denoted by reference 5a, partially masks the corresponding piezoelectric element 1a, as described with reference to FIG. 2a-FIG. 4. FIG. 6a illustrates such configuration of the electrical masking assembly 5a (respectively 5b) relative to the piezoelectric element 1a (respectively 1b) within detector 20a (respectively 20b). The measurement result which is delivered by the subtraction unit 21 for the electrical field E is then $f_a-f_0=K_a\cdot E$.

Figure 6B:
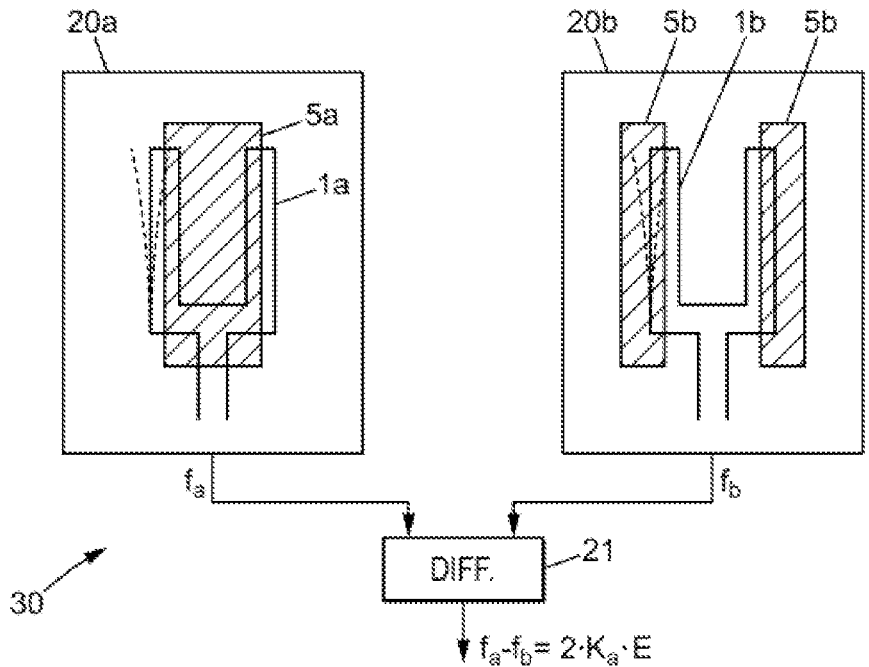
FIG. 6b shows a second possible variant for the detection assembly of FIG. 5.

According to another possibility, electrical masking assembly 5b of detector 20b may mask a limited part of the piezoelectric element 1b of detector 20b, this part being complementary to the part masked by electrical masking assembly 5a of detector 20a for piezoelectric element 1a of detector 20a. FIG. 6b corresponds to FIG. 6a for such other configuration. In this case: $K_b=-K_a$, and the measurement result which is delivered by the subtraction unit 21 for the electrical field E is: $f_a-f_b=2\cdot K_a\cdot E$.

It is understood that the invention may be reproduced while modifying secondary aspects of the embodiments described in detail above, while still retaining at least some of the cited advantages. In particular, piezoelectric elements which have geometries different from those shown in FIG. 2a and FIG. 3 may be used. In addition, electronic modules different from those described but with equivalent functions may be used instead of those described.

The invention claimed is:

1. An electrical field detector, comprising:
   an electromechanical oscillator, of which at least part is comprised of a piezoelectric element intended to vibrate at an oscillation frequency during use of the detector;
   a frequency measuring device, which is coupled to the oscillator so as to measure the oscillation frequency; and
   an electrical masking assembly, which is arranged close to the piezoelectric element without contact with said piezoelectric element, so that, during the use of the detector, the piezoelectric element moves by vibrating relative to the electrical masking assembly, the electrical masking assembly being further arranged so that a part of the piezoelectric element which is exposed to an electrical field to be measured during the use of the detector, while being restricted by said electrical masking assembly, varies during each oscillation of the oscillator,
   the electrical field to be measured acting on the exposed and variable part of the piezoelectric element during the use of the detector, thereby producing a change in the oscillation frequency which is measured by the frequency measuring device, said oscillation frequency forming an electrical field strength measurement result.

2. The detector according to claim 1, wherein the piezoelectric element is a portion of crystal quartz, a portion of aluminum nitride, a portion of gallium phosphate, or a portion of a crystal having the chemical formula $La_3Ga_{5.5}Ta_{0.5}O_{14}$.

3. The detector according to claim 1, wherein the piezoelectric element comprises a beam intended to vibrate by bending during the use of the detector, or the piezoelectric element comprises two parallel beams each intended to vibrate by bending during the use of the detector, both beams being connected to each other by a respective first end of each of said two beams, the other end of each beam, opposite the first end of the same beam, being free,
   or the piezoelectric element comprises two parallel beams each intended to vibrate by bending during the use of the detector, both beams being connected to each other both by two respective first ends of said beams, and also by two other respective ends of said beams, opposite said two first ends.

4. The detector according to claim 1, wherein the electrical masking assembly comprises at least one metal portion, an edge of said metal portion being arranged in front of the piezoelectric element so as to partially mask said piezoelectric element with respect to the electrical field to be measured, at at least one instant during each oscillation.

5. The detector according to claim 4, wherein the electrical masking assembly comprises two metal portions, which produce identical partial maskings of the piezoelectric element with respect to the electrical field to be measured, symmetrically on two opposite sides of said piezoelectric element, when the detector is oriented so that said two metal portions are perpendicular to the electrical field to be measured.

6. The detector according to claim 1, wherein the electromechanical oscillator comprises, in addition to the piezoelectric element, at least one electronic amplifier which is electrically connected to electrodes in contact with the piezoelectric element, so as to form a loss-compensation oscillator loop structure.

7. The detector according to claim 6, wherein one of the electrodes is electrically connected to an output of the amplifier, in order to transmit an excitation voltage to the piezoelectric element during the use of the detector, and another of the electrodes is connected to an input of an electrical current detection system in order to detect a response electrical current originating from the piezoelectric element, and an output of the electrical current detection system is connected to an input of the amplifier.

8. The detector according to claim 6, wherein one of the electrodes is located on the piezoelectric element at a location of said piezoelectric element which is masked by the electrical masking assembly with respect to the electrical field to be measured, during the use of the detector.

9. An electrical field detection assembly, comprising two detectors each according to claim 1, said two detectors having respective piezoelectric elements which are identical, and respective electrical masking assemblies which are different, so that the electrical field to be measured, when said electrical field to be measured is non-zero, produces changes in the oscillation frequency which differ between both detectors,
   the detection assembly further comprising a subtraction unit, arranged to characterize a difference between the oscillation frequencies measured by the frequency measuring devices of both detectors, said difference forming another electrical field strength measurement result, which is less sensitive to variations in ambient temperature than the measurement results delivered separately by each of the two detectors.

10. The detector of claim 3, wherein the beam has a first fixed end and another free end opposite the first end.

11. The detector according to claim 6, wherein each of the electrodes is located on the piezoelectric element at a location of said piezoelectric element which is masked by the electrical masking assembly with respect to the electrical field to be measured, during the use of the detector.

12. The detector according to claim 2, wherein the piezoelectric element comprises a beam intended to vibrate by bending during the use of the detector,
   or the piezoelectric element comprises two parallel beams each intended to vibrate by bending during the use of the detector, both beams being connected to each other by a respective first end of each of said two beams, the other end of each beam, opposite the first end of the same beam, being free,
   or the piezoelectric element comprises two parallel beams each intended to vibrate by bending during the use of the detector, both beams being connected to each other both by two respective first ends of said beams, and also by two other respective ends of said beams, opposite said two first ends.

13. The detector according to claim 2, wherein the electrical masking assembly comprises at least one metal portion, an edge of said metal portion being arranged in front of the piezoelectric element so as to partially mask said piezoelectric element with respect to the electrical field to be measured, at at least one instant during each oscillation.

14. The detector according to claim 3, wherein the electrical masking assembly comprises at least one metal portion, an edge of said metal portion being arranged in front of the piezoelectric element so as to partially mask said piezoelectric element with respect to the electrical field to be measured, at at least one instant during each oscillation.

15. The detector according to claim 13, wherein the electrical masking assembly comprises two metal portions, which produce identical partial maskings of the piezoelectric element with respect to the electrical field to be measured, symmetrically on two opposite sides of said piezoelectric element, when the detector is oriented so that said two metal portions are perpendicular to the electrical field to be measured.

16. The detector according to claim 14, wherein the electrical masking assembly comprises two metal portions, which produce identical partial maskings of the piezoelectric element with respect to the electrical field to be measured, symmetrically on two opposite sides of said piezoelectric element, when the detector is oriented so that said two metal portions are perpendicular to the electrical field to be measured.

17. The detector according to claim 2, wherein the electromechanical oscillator comprises, in addition to the piezoelectric element, at least one electronic amplifier which is electrically connected to electrodes in contact with the piezoelectric element, so as to form a loss-compensation oscillator loop structure.

18. The detector according to claim 3, wherein the electromechanical oscillator comprises, in addition to the piezoelectric element, at least one electronic amplifier which is electrically connected to electrodes in contact with the piezoelectric element, so as to form a loss-compensation oscillator loop structure.

19. The detector according to claim 4, wherein the electromechanical oscillator comprises, in addition to the piezoelectric element, at least one electronic amplifier which is electrically connected to electrodes in contact with the piezoelectric element, so as to form a loss-compensation oscillator loop structure.

20. The detector according to claim 5, wherein the electromechanical oscillator comprises, in addition to the piezoelectric element, at least one electronic amplifier which is electrically connected to electrodes in contact with the piezoelectric element, so as to form a loss-compensation oscillator loop structure.

* * * * *